United States Patent
Kim et al.

(10) Patent No.: US 11,910,627 B2
(45) Date of Patent: Feb. 20, 2024

(54) ORGANIC LIGHT EMITTING DEVICE AND ORGANIC LIGHT EMITTING DISPLAY DEVICE USING THE SAME

(71) Applicant: LG Display Co., Ltd., Seoul (KR)

(72) Inventors: Changeun Kim, Seoul (KR); Sujeong Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 160 days.

(21) Appl. No.: 17/466,834

(22) Filed: Sep. 3, 2021

(65) Prior Publication Data

US 2022/0173345 A1  Jun. 2, 2022

(30) Foreign Application Priority Data

Dec. 1, 2020 (KR) .......................... 10-2020-0165934

(51) Int. Cl.
| | | |
|---|---|---|
| H01L 51/52 | (2006.01) | |
| H10K 50/11 | (2023.01) | |
| H10K 50/814 | (2023.01) | |
| H10K 50/824 | (2023.01) | |
| H10K 59/12 | (2023.01) | |
| H10K 102/10 | (2023.01) | |

(52) U.S. Cl.
CPC ........... *H10K 50/11* (2023.02); *H10K 50/814* (2023.02); *H10K 50/824* (2023.02); *H10K 59/12* (2023.02); *H10K 2102/102* (2023.02); *H10K 2102/103* (2023.02)

(58) Field of Classification Search
CPC .............................................. H10K 2102/103
See application file for complete search history.

(56) References Cited

U.S. PATENT DOCUMENTS

| 7,800,102 | B2 | 9/2010 | Park et al. | |
|---|---|---|---|---|
| 10,615,231 | B2 * | 4/2020 | Wu | H10K 50/81 |
| 2003/0201164 | A1 * | 10/2003 | Johnson | C23C 14/352 |
| | | | | 204/192.27 |
| 2010/0240167 | A1 * | 9/2010 | Dasgupta | H01L 31/0352 |
| | | | | 257/E31.032 |

(Continued)

FOREIGN PATENT DOCUMENTS

| KR | 10-0708720 B1 | 4/2007 | |
|---|---|---|---|
| KR | 10-2015-0124475 A | 11/2015 | |
| WO | WO-2008105614 A1 * | 9/2008 | C03C 17/3417 |

OTHER PUBLICATIONS

Schiavo et al, Ab initio study of Cu-based delafossites as alternative to nickel oxide in photocathodes: effects of Mg-doping and surface electronic features, 2018, Physical Chemistry Chemical Physics, Researchgate, pp. 1-22. (Year: 2018).*

(Continued)

*Primary Examiner* — Chad M Dicke
*Assistant Examiner* — Valerie N Newton
(74) *Attorney, Agent, or Firm* — Seed IP Law Group LLP

(57) ABSTRACT

An organic light-emitting device an improved anode structure and an organic electroluminescent display device using the same are provided. The anode structure has a 3 layers stack structure in which a layer closest to an organic light-emissive layer of the organic light-emitting device is made of a material with a high work function such as 5.1 to 5.3 eV. Thus, hole injection efficiency is improved and occurrence of dark spots is suppressed.

15 Claims, 10 Drawing Sheets

(56) References Cited

U.S. PATENT DOCUMENTS

2012/0055532 A1* 3/2012 Wang ................ H01L 25/0753
257/E33.064
2019/0221633 A1* 7/2019 Gai ...................... G09G 3/3225

OTHER PUBLICATIONS

Lan et al, Improvement of CuAlO2 thin film electrical conduction by the anisotropic conductivity, 2007, Materials Research Society, Journal of Materials Research, vol. 22 No. 12, pp. 3338-3343. (Year: 2007).*

Schlaf et al, Work Function measurements on indium tin oxide films, May 2001, Elsevier, Journals of Electron Spectroscopy and Related Phenomena, vol. 120, pp. 149-154. (Year: 2001).*

\* cited by examiner

ORGANIC LIGHT EMITTING DEVICE AND ORGANIC LIGHT EMITTING DISPLAY DEVICE USING THE SAME

CROSS-REFERENCE TO RELATED APPLICATION

This application claims a benefit under 35 U.S.C. § 119(a) of Korean Patent Application No. 10-2020-0165934 filed on Dec. 1, 2020, on the Korean Intellectual Property Office, the entirety of disclosure of which is incorporated herein by reference for all purposes.

BACKGROUND

Technical Field

The present disclosure relates to an organic light-emitting device. More specifically, the present disclosure relates to an organic light-emitting device that may improve hole injection efficiency and suppress a dark spot.

Further, the present disclosure relates to an organic electroluminescent display device having the organic light-emitting device.

Description of the Related Art

A display device displays an image. Recently, along with development of display technology, a flat display device has been widely used. The flat display device includes a liquid crystal display device, an organic electroluminescent display device, and a micro LED display device.

The organic electroluminescent display device is capable of self-luminescence, and thus has excellent viewing angle and contrast ratio, and does not require a backlight and thus is lightweight and thin, and is advantageous in power consumption. Further, the organic electroluminescent display device may operate at a DC low voltage and has a fast response speed, and has a low manufacturing cost.

An organic light-emitting device is included in the organic electroluminescent display device. The organic light-emitting device has a structure in which an organic light-emissive layer is disposed between two electrodes, that is, an anode and a cathode.

ITO (Indium Tin Oxide) is generally used as the anode of the organic light-emitting device. However, ITO may not improve hole injection efficiency due to a low work function value thereof, and is vulnerable to a dark spot due to a short circuit with the cathode due to low resistance thereof.

BRIEF SUMMARY

Based on one or more problems in the related art, the inventors of the present disclosure have recognized that there is a benefit for an organic light-emitting device including an improved anode capable of reducing the occurrence of the dark spots and having an improved hole injection effect, compared to the conventional anode made of the ITO material.

One or more embodiments of the present disclosure provide an organic light-emitting device that may have an improved hole injection efficiency and may reduce possibility of dark spot occurrence due to a short circuit with a cathode.

In addition, some embodiments of the present disclosure provide an organic electroluminescent display device including the organic light-emitting device.

Technical benefits of the present disclosure are not limited to the above-mentioned benefits. Other benefits and advantages in accordance with the present disclosure as not mentioned above may be understood from following descriptions and more clearly understood from embodiments in accordance with the present disclosure. Further, it will be readily appreciated that the benefits and advantages in accordance with the present disclosure may be realized by features and combinations thereof as disclosed in the claims.

One aspect of the present disclosure provides an organic light-emitting device comprising: an anode; an organic light-emissive layer on the anode; and a cathode on the organic light-emissive layer, wherein the anode includes: a first layer; a second layer on the first layer, wherein the second layer includes a metal; and a third layer disposed on the second layer, wherein the third layer has a higher work function than a work function of the first layer.

In one implementation of the organic light-emitting device, the first layer includes indium tin oxide (ITO) or indium zinc oxide (IZO).

In one implementation of the organic light-emitting device, the metal of the second layer includes at least one of silver (Ag) or molybdenum (Mo).

In one implementation of the organic light-emitting device, the third layer has a work function of 5.1 to 5.3 eV.

In one implementation of the organic light-emitting device, the third layer includes copper aluminum oxide, copper gallium oxide or copper aluminum gallium oxide.

In one implementation of the organic light-emissive, the third layer has a resistivity of $10^2$ to $10^5$ Ω·cm.

In one implementation of the organic light-emissive, the third layer is made of copper aluminum oxide, wherein the copper aluminum oxide is composed of 50 to 60% by weight of CuO and 40 to 50% by weight of $Al_xGa_{2x-1}O_3$ (0≤x≤2).

In one implementation of the organic light-emitting device, the third layer has a thickness of 50 to 150 Å.

Another aspect of the present disclosure provides an organic electroluminescent display device comprising: a first substrate; a thin-film transistor disposed on the first substrate; an anode on the first substrate having the thin-film transistor, where the anode is electrically connected to the thin-film transistor; an organic light-emissive layer on the anode; and a cathode on the organic light-emissive layer, wherein the anode includes: a first layer; a second layer on the first layer, wherein the second layer includes a metal; and a third layer on the second layer, wherein the third layer has a higher work function than a work function of the first layer.

In one implementation of the organic electroluminescent display device, the organic electroluminescent display device further comprises a cathode auxiliary electrode coplanar with the anode, and electrically connected to the cathode.

In one implementation of the organic electroluminescent display device, the first layer includes indium tin oxide (ITO) or indium zinc oxide (IZO).

In one implementation of the organic electroluminescent display device, the metal of the second layer includes at least one of silver (Ag) or molybdenum (Mo).

In one implementation of the organic electroluminescent display device, the third layer has a work function of 5.1 to 5.3 eV.

In one implementation of the organic electroluminescent display device, the third layer includes copper aluminum oxide, copper gallium oxide or copper aluminum gallium oxide.

In one implementation of the organic electroluminescent display device, the third layer has a resistivity of $10^2$ to $10^5$ Ω·cm.

In one implementation of the organic electroluminescent display device, the third layer is made of copper aluminum oxide, wherein the copper aluminum oxide is composed of 50 to 60% by weight of CuO and 40 to 50% by weight of $Al_xGa_{2-x}O_3$ (0≤x≤2).

In one implementation of the organic electroluminescent display device, the third layer has a thickness of 50 to 150 Å.

Effects in accordance with the present disclosure may be as follows but may not be limited thereto.

In the organic light-emitting device according to the present disclosure, the anode has the 3-layers structure, wherein the layer thereof adjacent to the organic light-emissive layer has a high work function value, such that the hole injection efficiency of the anode may be improved, and the occurrence of dark spots due to a short circuit with the cathode may be reduced.

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

In addition to the effects as described above, specific effects in accordance with the present disclosure will be described together with the detailed description for carrying out the disclosure.

DETAILED DESCRIPTIONS

Figure 1:
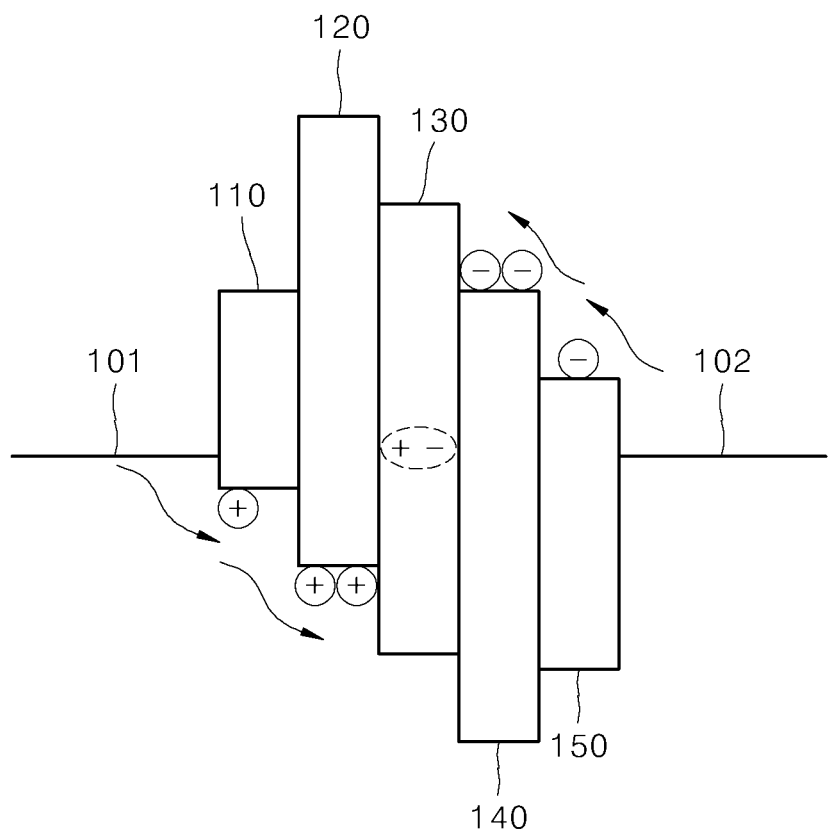
FIG. 1 schematically shows a light-emission principle of an organic light-emitting device.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs.

A shape, a size, a ratio, an angle, a number, etc., disclosed in the drawings for describing the embodiments of the present disclosure are examples, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event may occur therebetween unless "directly after," "directly subsequent" or "directly before" is not indicated.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, one or more embodiments of an organic light-emitting device according to the present disclosure and an organic electroluminescent display device using the same will be described in detail with reference to the accompanying drawings.

FIG. 1 schematically shows a light-emission principle of an organic light-emitting device. The organic light-emitting device includes an anode 101, a cathode 102, and organic compound layers 110 to 150 disposed between the anode 101 and the cathode 102.

When the organic light-emitting device is applied to an organic electroluminescent display device, the anode 101 may be electrically connected to a pixel electrode and the cathode 102 may be electrically connected to a common electrode.

An organic light-emissive layer 130 is included in the organic compound layers 110 to 150 disposed between the anode 101 and the cathode 102. Further, as shown in FIG. 1, the organic compound layers 110 to 150 disposed between the anode 101 and the cathode 102 may include a hole injection layer 110, a hole transport layer 120, an electron transport layer 140, and an electron injection layer 150.

When a driving voltage is applied to the anode 101 and the cathode 102, holes passing through the hole injection layer 110 and the hole transport layer 120 and electrons passing through the electron injection layer 150 and the electron transport layer 140 are transferred to the organic light-emissive layer 130 where excitons are generated. As a result, light of a selected or predetermined wavelength is emitted from the organic light-emissive layer 130.

Figure 2:
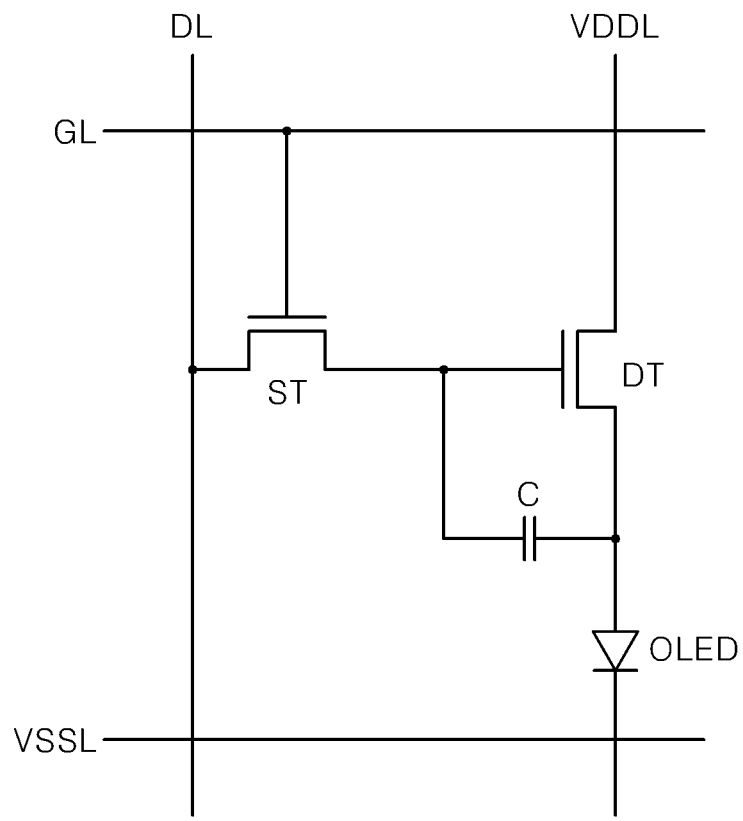
FIG. 2 schematically shows a pixel structure of an organic electroluminescent display device.

FIG. 2 schematically shows a pixel structure of an organic electroluminescent display device.

Referring to FIG. 2, a pixel area of the organic electroluminescent display device is defined by a gate line GL extending in a first direction, and a data line DL and a driving power line VDDL spaced apart from each other and extending in a second direction transverse to the first direction.

In the pixel area, a switching thin-film transistor ST, a driving thin-film transistor DT, a storage capacitor C, and an organic light-emitting device OLED are formed. In the organic electroluminescent display device, pixels, each including the organic light-emitting device of the structure as shown in FIG. 1 may be arranged in a matrix form. The electroluminescent display device may selectively control the pixels using a data voltage and a scan voltage to display an image.

The switching thin-film transistor ST may be turned on according to a gate signal supplied to the gate line GL to supply a data signal supplied to the data line DL to the driving thin-film transistor DT.

Further, the driving thin-film transistor DT may be switched on according to the data signal supplied from the switching thin-film transistor ST to control current flowing from a driving power line VDDL to the organic light emitting diode OLED.

The storage capacitor C is connected to and disposed between a gate electrode of the driving thin-film transistor DT and a base power line VSSL to store therein a voltage corresponding to the data signal supplied to the gate electrode of the driving thin-film transistor DT. The storage capacitor C uses the stored voltage to keep a turn-on state of the driving transistor DT constant for a 1 frame.

The organic light emitting diode OLED is electrically connected and disposed between a source or drain electrode of the driving thin-film transistor DT and the base power line VSSL to emit light using current corresponding to the data signal supplied from the driving thin-film transistor DT.

The organic electroluminescent display device may be classified into a passive matrix type or an active matrix type using a TFT as a switching element. The organic electroluminescent display device of the active matrix type selectively turns on a thin-film transistor as an active element to select a pixel and maintains a light emission state of the selected pixel using the voltage maintained in the storage capacitor C.

The organic electroluminescent display device operating in this way may be classified into a top emission type, a bottom emission type, and a dual emission type based on a direction in which light is emitted.

The top emissive type organic electroluminescent display device may emit light in a direction away from a substrate where the pixels are arranged, and may have an increased aperture ratio, compared to the bottom-emissive type device in which light is emitted in a direction toward the substrate in which the pixels are arranged. Thus, the top emissive type organic electroluminescent display device has been widely used in recent years. This top-emissive type organic electroluminescent display device has an anode on a bottom face of an organic compound layer and a cathode on a top face of the organic compound layer through which light is transmitted.

For the top emission, the cathode is composed of a transmissive film or a semi-transmissive film. For example, the cathode may be composed of an indium zinc oxide (IZO) thin-film having a thickness of about 100 Å.

Figure 3:
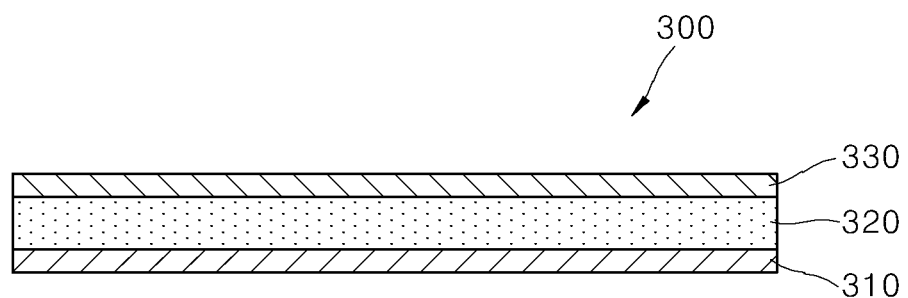
FIG. 3 schematically shows an example of an anode structure of an organic light-emitting device according to the present disclosure.

FIG. 3 schematically shows an example of an anode structure of an organic light-emitting device according to the present disclosure.

Referring to FIG. 3, an anode 300 of the organic light-emitting device according to the present disclosure includes a first layer 310, a second layer 320, and a third layer 330. In this connection, the third layer 330 is the closest portion to the organic light-emissive layer.

The first layer 310 is a lower layer of the anode and is connected to a drain electrode of the thin-film transistor. The first layer 310 may include indium tin oxide (ITO) or indium zinc oxide (IZO). The first layer 310 may have a work function of about 4.5 to 4.8 eV, and may exhibit a resistivity of about $10^{-3}$ to $10^{-4}$ Ω·cm. When the first layer 310 is made of a material having remarkably high resistance such as CuAlO$_x$, delay in signal transmission may occur. Accordingly, unlike the third layer 330 to be described later, in some embodiments, the first layer 310 is made of indium tin oxide (ITO) or indium zinc oxide (IZO) having low resistance.

The first layer 310 may have a thickness of about 100 to 500 Å.

The second layer 320 is disposed on a top face of the first layer 310. The second layer 320 includes metal. The metal of the second layer 320 may include reflective metal. More specifically, the metal of the second layer 320 may include at least one of silver (Ag) or molybdenum (Mo).

The organic light-emitting device according to the present disclosure may have the anode whose the second layer is made of the metal, and thus may be applied to a top-emissive organic electroluminescent display device.

The third layer 330 is disposed on a top face of the second layer 320.

In the anode of the organic light-emitting device according to the present disclosure, the third layer 330 is made of a material having a higher work function than that of the first layer 310.

In order to increase the hole injection efficiency, an energy difference between the work function of the anode and a HOMO (Highest Occupied Molecular Orbital) level of the hole injection layer must be small, thereby lowering a hole injection barrier. To lower the hole injection barrier, it is beneficial to reduce the difference between the work function of the anode and a work function of the hole injection layer. The work function of the hole transport layer currently used in OLED is in a range of about 5.1 to 5.4 eV.

The third layer 330 may have a work function of 5.1 to 5.3 eV. When the third layer 330 of the anode has a high work function, the hole injection barrier as described above may be lowered, thereby increasing the hole injection efficiency.

In one example, it is beneficial for the third layer 330 of the anode to have a resistance greater than that of ITO. This is because a short-circuit between the anode and the cathode as caused by a foreign material may be reduced, and as a result, the dark spot occurrence may be reduced.

The third layer 330 may include copper aluminum oxide, copper gallium oxide, or copper aluminum gallium oxide.

The third layer 330 made of copper aluminum oxide as described above may have a resistivity of $10^2$ to $10^5$ Ω·cm. Further, in some embodiments, the third layer 330 may have a sheet resistance of $10^8$ to $10^{11}$ Ω/sq. The resistance characteristic of the third layer 330 may be controlled via a partial pressure of oxygen inside a reaction chamber during deposition. During the deposition, the higher the partial pressure of oxygen in the reaction chamber, the lower the resistance of copper aluminum oxide. To the contrary, the lower the partial pressure of oxygen in the reaction chamber during the deposition, the higher the resistance of copper aluminum oxide.

In some embodiments, copper aluminum oxide of the third layer 330 may be composed of 50 to 60% by weight of CuO and 40 to 50% by weight of $Al_xGa_{2-x}O_3$ (0≤x≤2). When the CuO content is smaller than 50% by weight, the resistivity value of the third layer 330 may exceed $10^5$ Ω·cm and may be excessively increased. When the CuO content exceeds 60% by weight, the resistivity value is too low and thus is lower than $10^2$ Ω·cm, so that the possibility of occurrence of the short circuit may increase.

The third layer may have a thickness of 50 to 150 Å.

When the thickness of the third layer is smaller than 50 Å, the resistance thereof may increase excessively. When the thickness of the third layer exceeds 150 Å, the possibility of occurrence of the short circuit may increase due to low resistance.

The organic electroluminescent display device according to the present disclosure may have a structure in which a thin-film transistor is disposed on a top face of a substrate, an anode is connected to the thin-film transistor, more specifically, a drain electrode of the thin-film transistor, an organic light-emissive layer is disposed on a top face of the anode, and a cathode is disposed on a top face of the organic light-emissive layer.

Figure 4:
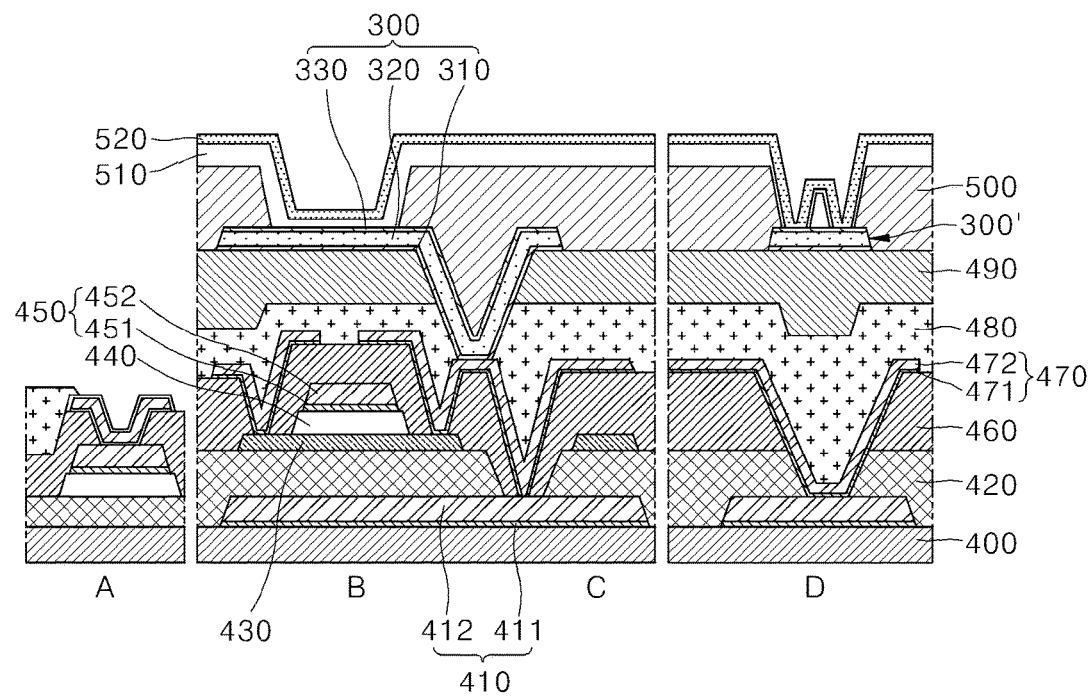
FIG. 4 schematically shows an example of an organic electroluminescent display device according to the present disclosure.

FIG. 4 schematically shows an example of an organic electroluminescent display device according to the present disclosure. In FIG. 4, an area of the organic electroluminescent display device may be divided into an pad area A, an thin-film transistor and opening area B, a storage capacitor area C, and an EVSS auxiliary electrode area D.

Referring to FIG. 4, the organic electroluminescent display device according to the present disclosure includes a substrate 400, a thin-film transistor, and an organic light-emitting device.

The substrate 400 may be made of a glass material, or be made of a polymer material such as polyimide.

In the thin-film transistor and opening area B, a light blocking layer 410 may be formed on the substrate 400. The light blocking layer 410 may have a single layer structure, or a double layers (411 and 412) structure as shown in FIG. 4.

Further, a layer having the same configuration or the same structure as the light blocking layer may be disposed in the EVSS auxiliary electrode area D as well. The layer having the same configuration or the same structure as the light blocking layer formed in the EVSS auxiliary electrode area D is electrically connected to a cathode 520 of the organic light-emitting device. Further, the layer having the same configuration or the same structure as the light blocking layer formed in the EVSS auxiliary electrode area D is electrically connected to an EVSS supply unit which controls the organic light-emitting device to emit light only during a light-emissive period, and controls the organic light-emitting device not to emit light during a sensing period.

A buffer layer 420 may be disposed on the substrate on which the light blocking layer 410 is disposed. The buffer layer may be made of a flexible inorganic compound. The buffer layer 420 may serve as an insulator to prevent invasion of moisture or air through the substrate, and the like.

The thin-film transistor may be disposed on a top face of the buffer layer 420. The thin-film transistor may include a semiconductor layer 430, a gate insulating film 440, a gate electrode 450, an interlayer insulating film 460, and a source/drain electrode layer 470. FIG. 4 shows an example in which the gate electrode 450 is made of a double layer structure 451 and 452, and the source/drain layer 470 is made of a double layer structure 471 and 472. However, the present disclosure is not necessarily limited thereto. The gate electrode or the source/drain electrode layer may be composed as a single layer.

In the pad area A, a conductive pad of a single layer structure or a multi-layer structure is formed. The conductive pad may include one or more of the same material as the gate electrode, the same material as the source/drain electrode, the same material as the anode, or the same material as the cathode.

On the substrate on which the thin-film transistor is disposed, a first protective layer 480 and a second protective layer (planarization layer) 490 are disposed. The first protective layer 480 may be made of a flexible inorganic compound, and the second protective layer 490 may be made of a photoacrylic compound (PAC). On the top of the second protective layer 490

The organic light-emitting device is disposed on a top face of the second protective layer 490. The organic light-emitting device includes an anode 300, an organic light-emissive layer 510 and a cathode 520.

The anode 330 is disposed in the thin-film transistor and opening area B and connects to a drain electrode of the thin-film transistor. The anode 330 may include a first layer 310, a second layer 320 disposed on a top face of the first layer and including the metal, and a third layer 330 disposed on a top face of the second layer and having a higher work function than that of the first layer.

Further, in the EVSS auxiliary electrode area D, a layer having the same structure of the anode 300 may be formed and may act as a cathode auxiliary electrode 300' which is electrically connected to the cathode 520. The cathode auxiliary electrode 300' may be coplanar with the anode 330. The cathode auxiliary electrode 300' also may be formed as a same layer with the anode 330

For top-emission, the cathode 520 is composed of a transmissive film or a semi-transmissive film. In this case, the cathode 520 has high resistance. Voltage drop (IR drop) occurs within the display panel due to the high resistance of the cathode, and accordingly, voltages of different levels are respectively applied to different pixels. This may cause luminance non-uniformity. In this connection, the cathode auxiliary electrode 300' may reduce the resistance of the cathode to improve the luminance uniformity of the display panel.

A bank 500 is formed on the second protective layer 490 on which the anode 300 and the cathode auxiliary electrode 300' are formed. The bank 500 has an opening defined therein for contact between the anode 300 and the organic light-emissive layer 510, and an opening defined therein to expose a portion of the cathode auxiliary electrode 300'.

The organic light-emissive layer 510 and the cathode 520 are disposed on a top face of the bank 500 having the opening defined therein.

In one example, the organic light-emissive layer 510 is not formed on the cathode auxiliary electrode, and the cathode 520 is disposed on the cathode auxiliary electrode.

Figure 5:
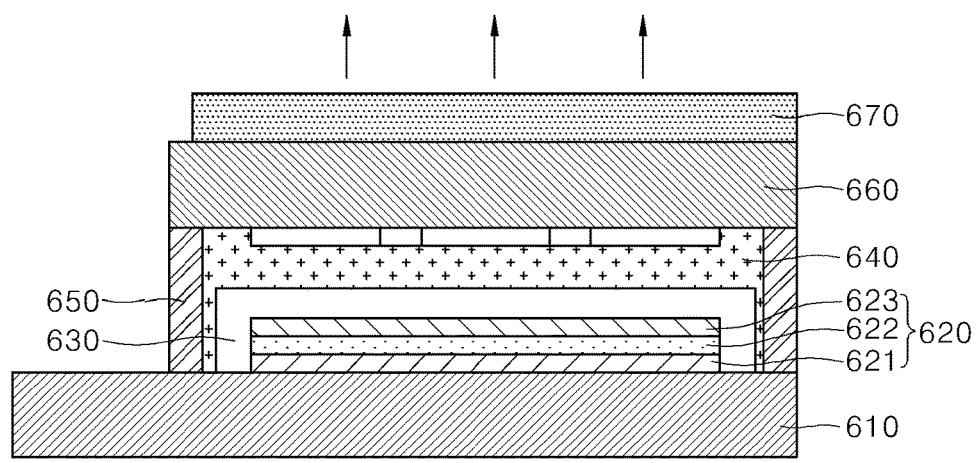
FIG. 5 shows an example in which an organic electroluminescent display device including an organic light-emitting device according to the present disclosure is combined with other elements.

FIG. 5 shows an example in which an organic electroluminescent display device including an organic light-emitting device according to the present disclosure is combined with other elements.

Referring to FIG. 5, the organic electroluminescent display device may additionally include a second substrate 660 bonded to a first substrate 610.

A thin-film transistor is disposed on a top face of the first substrate 610. On the first substrate 610, an organic light-emitting device 620 including an anode 621, an organic light-emissive layer 622, and a cathode 623 is disposed. In this connection, as described above, the anode 621 may include the first layer, the second layer including the metal, and the third layer having a higher work function than that of the first layer.

A passivation layer 630 may be formed on a surface of the organic light-emitting device 620.

A color filter may be disposed on one face of the second substrate 660. FIG. 5 shows an example in which the color filter is disposed on one face facing toward the first substrate 610 among both opposing faces of the second substrate 660. Further, FIG. 5 shows an example in which a hard coating layer 670 is disposed on an opposite face of the second substrate 600 to one face thereof on which the color filter is disposed.

The first substrate 610 and the second substrate 660 may be bonded to each other via a dam 650. The dam 650 may contain a filler 640 to maintain a gap between the first substrate and the second substrate and prevent moisture invasion.

EXAMPLES

Hereinafter, Present Examples are presented to help understand the present disclosure. However, the following Present Examples are only provided for easier understanding of the present disclosure, and the present disclosure is not limited to the following Present Examples.

Example 1

Manufacturing of Anode Specimen and Characteristic Evaluation Thereof

Anode specimens according to Present Examples 1 to 6 and Comparative Example 1 were manufactured. In the anode specimens according to Present Examples 1 to 6 and Comparative Example 1, a thickness of the first layer (ITO) as the lower layer was 100 Å, a thickness of the second layer (Ag) was 1000 Å, and that of the third layer (ITO or $CuAlO_x$) as the upper layer was 100 Å.

Resistivity and work function values for the anode specimens according to the manufactured Present Examples 1 to 6 and Comparative Example 1 were measured. A sheet resistance was measured using a 4-point probe surface resistance measuring device, and then the resistivity was calculated using the measured value and a thin-film thickness. The work function was measured using a work function measurement device.

In a following Table 1, an oxygen partial pressure refers to an oxygen partial pressure inside a reaction chamber when a $CuAlO_x$ layer is deposited.

TABLE 1

| Examples | Anode structure | $CuO:Al_2O_3$ (weight ratio) | Oxygen partial pressure (%) | Resistivity ($\Omega \cdot cm$) | Work function (eV) |
|---|---|---|---|---|---|
| Comparative Example 1 | I/A/I | — | — | $10^{-2}$ | 4.7 |
| Present Example 1 | H/A/I | 4:6 | 5 | $10^7$ | 5.1~5.3 |
| Present Example 2 | H/A/I | 4:6 | 10 | $10^6$ | |
| Present Example 3 | H/A/I | 5:5 | 5 | $10^5$ | |
| Present Example 4 | H/A/I | 5:5 | 10 | $10^4$ | |
| Present Example 5 | H/A/I | 6:4 | 5 | $10^4$ | |
| Present Example 6 | H/A/I | 6:4 | 10 | $10^2$ | |

※ I/A/I : ITO/Ag/ITO
※ H/A/I: CuAlOx/Ag/ITO

Referring to Table 1, the anode specimen according to Comparative Example 1 having an ITO/Ag/ITO stack structure exhibited a relatively low work function value of 4.7 eV, which corresponds to the work function value of ITO constituting the upper layer. On the other hand, the anode specimens according to Present Examples 1 to 6 which has a $CuAlO_x$/Ag/ITO stack structure exhibited a relatively higher work function value of 5.1 to 5.3, compared to that of Comparative Example 1. The relatively higher work function value of 5.1 to 5.3 corresponds to a work function of $CuAlO_x$ constituting the upper layer.

As may be seen in Table 1, the anode structure according to each of Present Examples 1 to 6 has a higher work function value than that of ITO. This brings about the effect of lowering the bi-hole injection barrier, and as a result, the hole injection efficiency of the organic light-emitting device may be improved.

Further, referring to Table 1, the anode specimen according to each of Present Examples 1 to 6 exhibited a relatively higher resistivity, compared to that of the anode specimen according to Comparative Example 1. This higher resistivity may contribute to reducing the occurrence of dark spots due to the short circuit between the anode and the cathode as caused by the foreign substances.

Further, referring to Table 1, in the anode specimens according to Present Examples 3 to 6 in which a weight ratio of CuO and $Al_2O_3$ is 5:5 or 6:4, the resistivity is relatively lower, that is, about $10^2$ to $10^5$ $\Omega\cdot cm$, compared to that in the anode specimen according to Present Examples 1 to 2 in which the weight ratio of CuO and $Al_2O_3$ is 4:6. Thus, the weight ratio of CuO and $Al_2O_3$ of 5:5 or 6:4 exhibited a resistivity value more suitable for the anode.

Further, referring to Table 1, it may be seen that even when the $CuO:Al_2O_3$ ratio is constant, the higher the oxygen partial pressure in the reaction chamber during the deposition, the lower the resistivity value.

Example 2

Manufacturing of Organic Light-Emitting Device Specimen and Characteristics Evaluation Thereof The same organic light-emissive layer (that is, the same hole injection layer, the same hole transport layer, the same light-emissive layer, the same electron transport layer and the same electron injection layer), and the same cathode were disposed on the anode specimen according to each of Comparative Example 1, and Present Example 3 and Present Example 6. Thus, an organic light-emitting device specimen according to each of Comparative Example 1, Present Example 3 and Present Example 6 was manufactured.

Further, the same organic light-emissive layer (that is, the same hole injection layer, the same hole transport layer, the same light-emissive layer, the same electron transport layer and the same electron injection layer), and the same cathode were disposed on the anode specimen according to each of Comparative Example 1, and Present Example 3 and Present Example 6. Thus, an organic light-emitting device specimen according to each of Comparative Example 2, Present Example 7 and Present Example 8 was manufactured.

The organic light-emitting device specimens according to Comparative Example 2, Present Example 7 and Present Example 8 are different from the organic light-emitting device specimens according to Comparative Example 1, Present Example 3 and Present Example 6 in that partial forced contact between the anode and the cathode is made in the former specimens.

Figure 6:
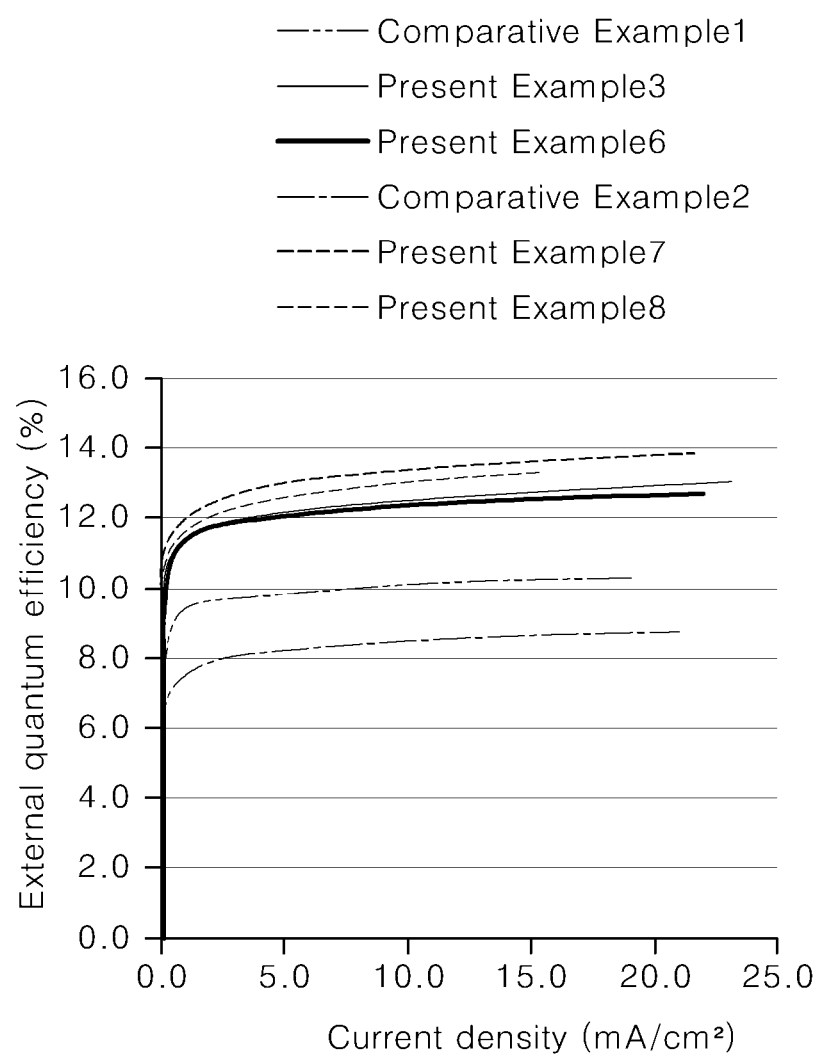
FIG. 6 shows external quantum efficiency based on a current density for each of specimens according to Present Example and Comparative Example.

FIG. 6 shows external quantum efficiency based on a current density of organic light-emitting device specimens according to the Present Examples and Comparative Examples.

Referring to FIG. 6, it may be seen that in the organic light-emitting device specimens according to Present Example 3, Present Example 6, Present Example 7 and Present Example 8, higher external quantum efficiency is exhibited in an entire current density range up to 25.0 $mA/cm^2$, compared to that of each of the organic light-emitting device specimens according to Comparative Examples 1 to 2.

Further, when comparing Comparative Example 1 and Comparative Example 2 with each other, in the organic light-emitting device specimen according to Comparative Example 2, the external quantum efficiency was greatly reduced due to the partial forced contact between the anode and the cathode. However, when comparing Present Example 3 and Present Example 7 with each other and Present Example 6 and Present Example 8 with each other, in the organic light-emitting device specimens according to Present Example 7 and Present Example 8, there was no significant decrease in the external quantum efficiency despite the partial forced contact between the anode and the cathode.

Figure 7:
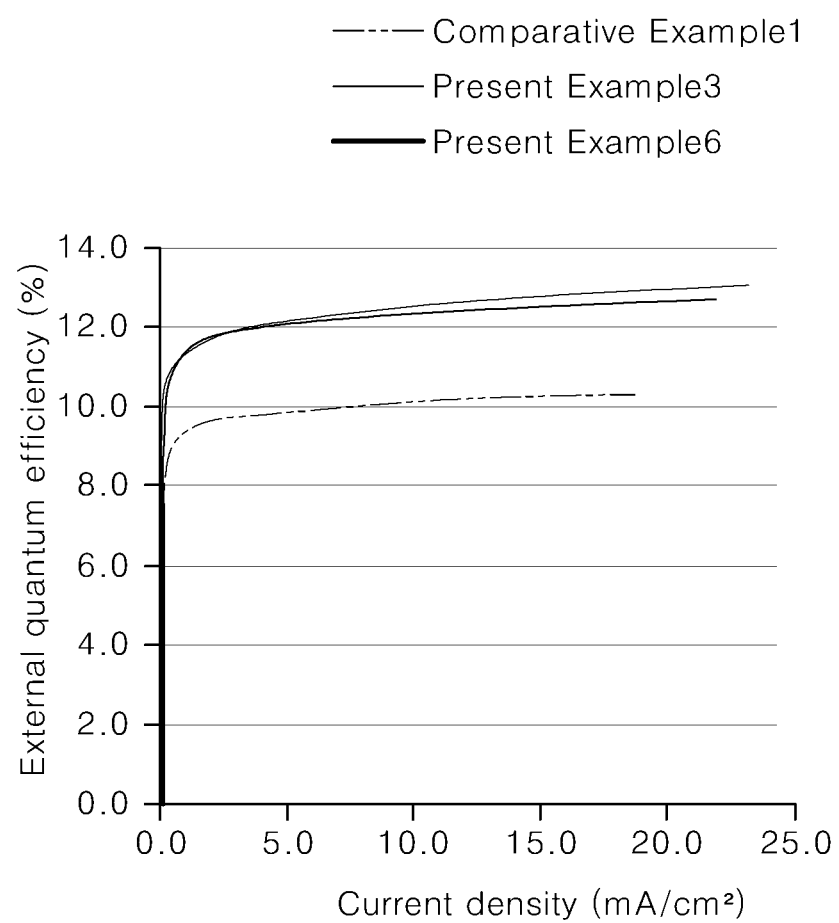
FIG. 7 shows an evaluation result of external quantum efficiency based on a current density for each of specimens in accordance with Comparative Example 1, Present Example 3, and Present Example 6.

FIG. 7 shows the evaluation results of external quantum efficiency based on a current density for specimens in accordance with Comparative Example 1, Present Example 3, and Present Example 6.

Referring to FIG. 7, in the organic light-emitting device specimens according to Present Example 3 and Present Example 6, the higher external quantum efficiency in the entire current density range up to 25.0 $mA/cm^2$ is exhibited, compared to that of the organic light-emitting device specimen according to Comparative Example 1.

Figure 8:
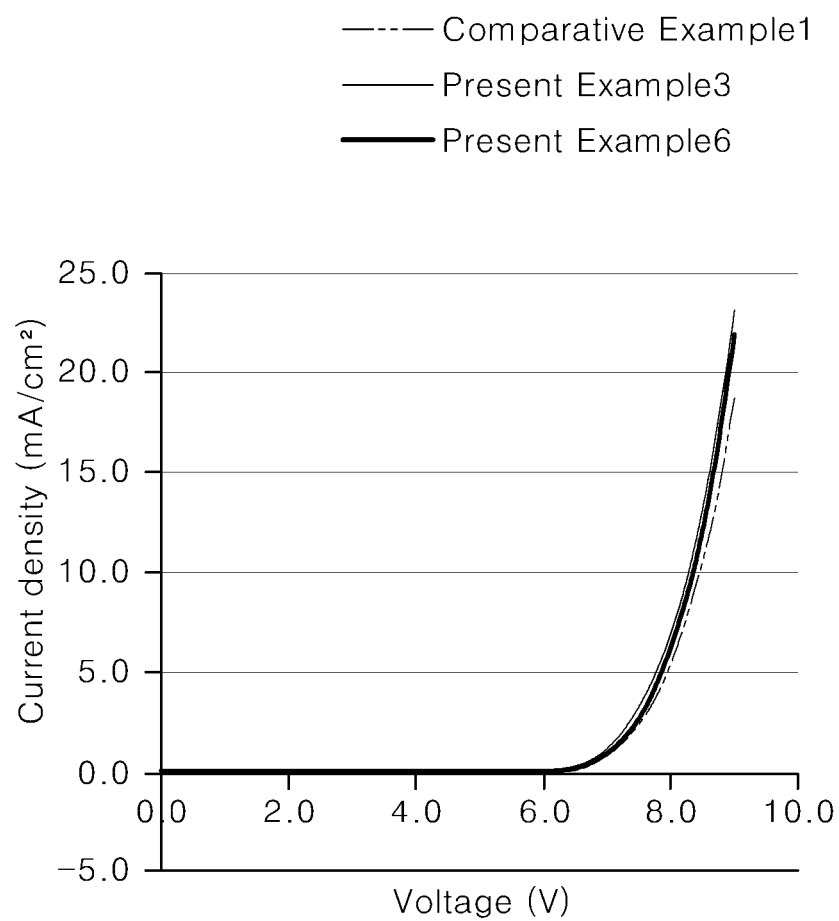
FIG. 8 shows an evaluation result of a critical voltage for each of specimens according to Comparative Example 1, Present Example 3, and Present Example 6.

FIG. 8 shows the evaluation results of critical voltages for specimens of Comparative Example 1, Present Example 3, and Present Example 6. Referring to FIG. 8, it may be seen that the organic light-emitting device specimens according to Comparative Example 1, Present Example 3, and Present Example 6 exhibit substantially the same critical voltage.

Figure 9:
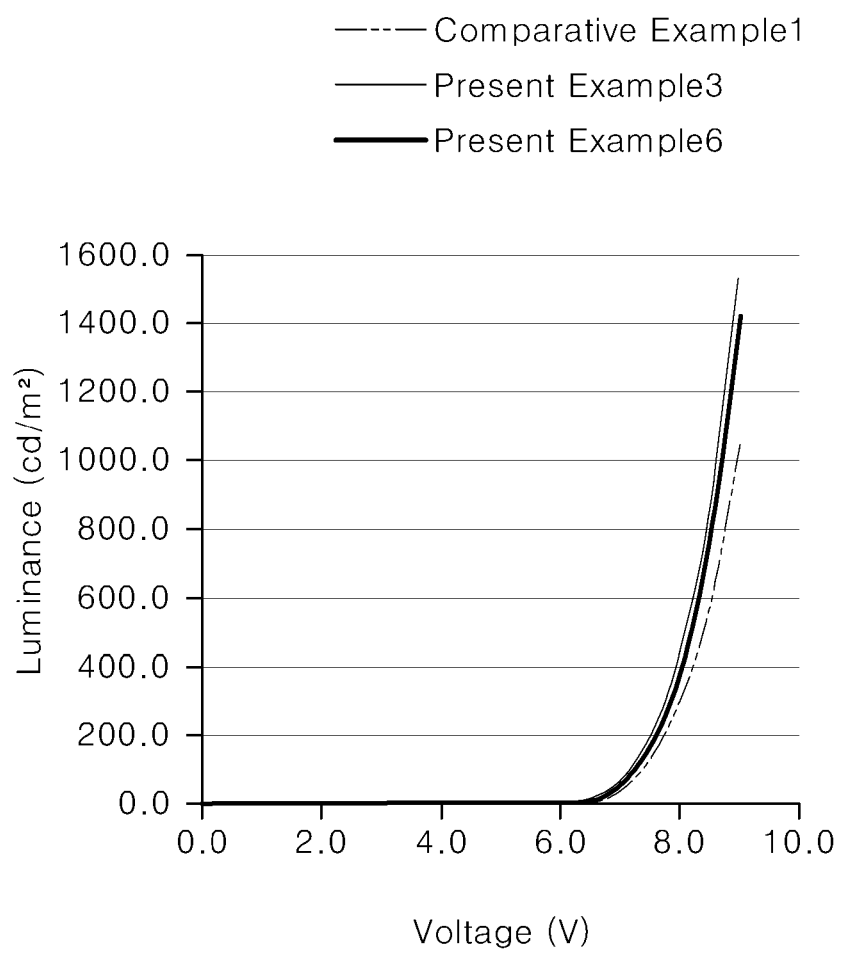
FIG. 9 shows an evaluation result of luminance based a voltage for each of specimens in accordance with Comparative Example 1, Present Example 3, and Present Example 6.

FIG. 9 shows the evaluation results of luminance based on the voltage for specimens in accordance with Comparative Example 1, Present Example 3, and Present Example 6.

Referring to FIG. 9, the organic light-emitting device specimens according to Present Example 3 and Present Example 6 exhibit relatively higher luminance, compared to that of the organic light-emitting device specimen according to Comparative Example 1.

Figure 10:
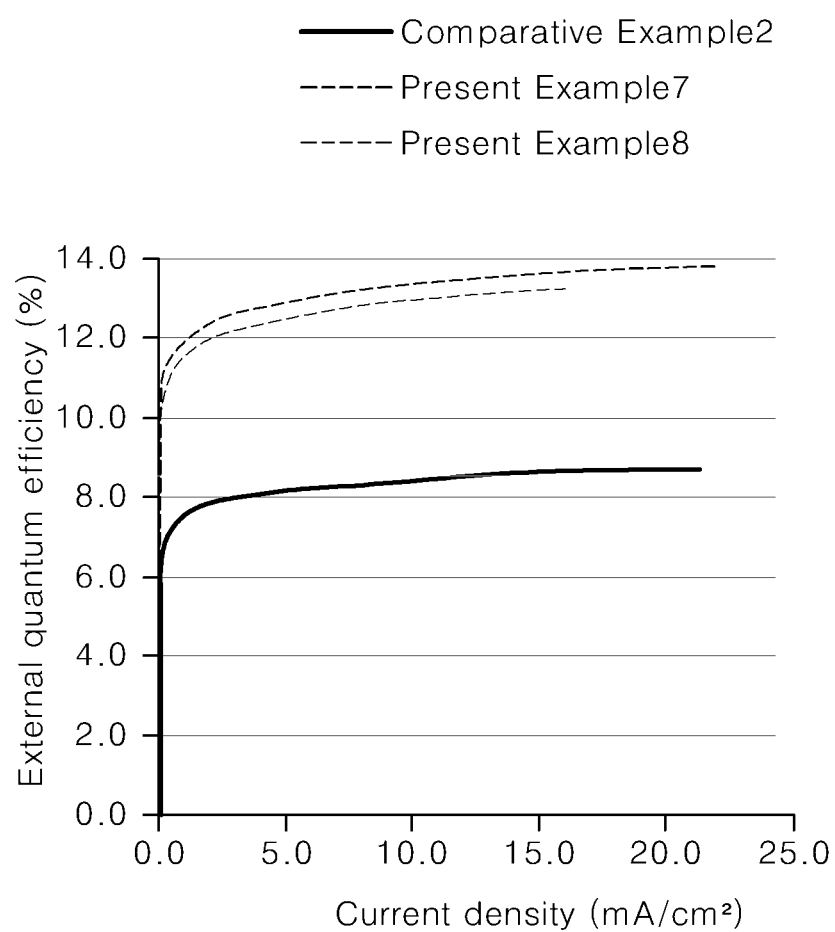
FIG. 10 shows an evaluation result of external quantum efficiency based on a current density for each of specimens according to Comparative Example 2, Present Example 7 and Present Example 8.

FIG. 10 shows the evaluation results of external quantum efficiency based on a current density for specimens of Comparative Example 2, Present Example 7 and Present Example 8. Referring to FIG. 10, the organic light-emitting device specimens according to Present Example 7 and Present Example 8 exhibit higher external quantum efficiency in the entire current density range up to 25.0 mA/cm$^2$, compared to that of the organic light-emitting device specimen according to Comparative Example 2.

Figure 11:
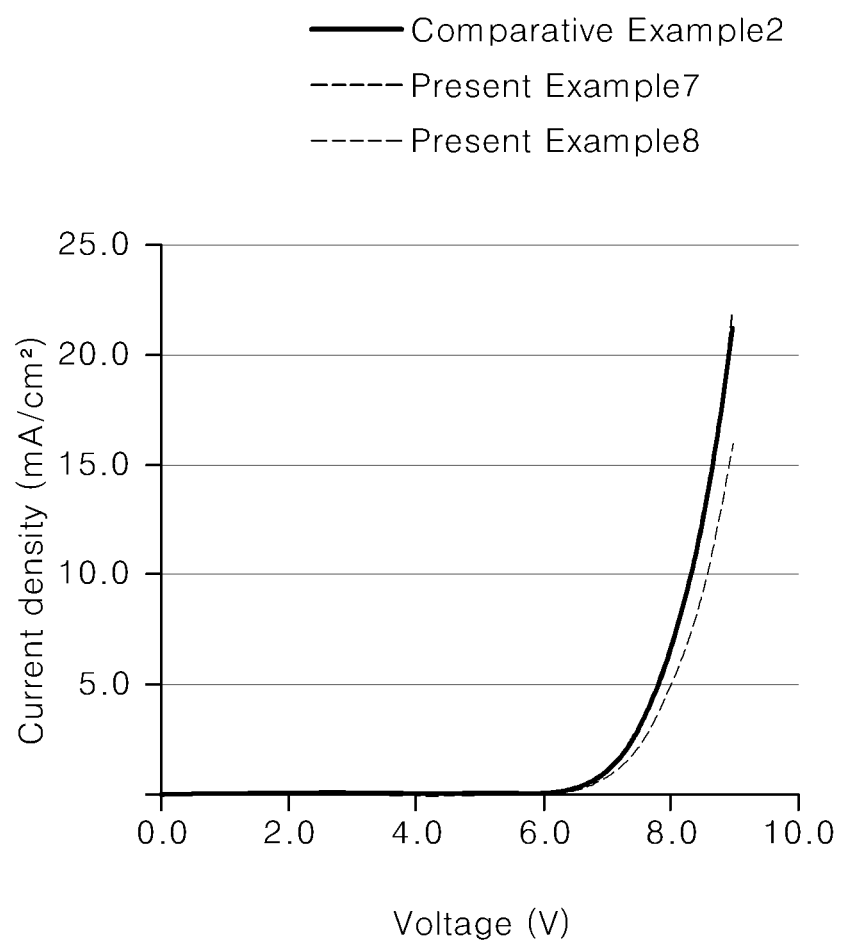
FIG. 11 shows an evaluation result of a critical voltage for each of specimens according to Comparative Example 2, Present Example 7 and Present Example 8.

FIG. 11 shows the evaluation results of critical voltages for specimens of Comparative Example 2, Present Example 7 and Present Example 8. Referring to FIG. 11, the organic light-emitting device specimens according to Present Example 3 and Present Example 6 exhibit an equivalent or higher critical voltage, compared to that of the organic light-emitting device specimen according to Comparative Example 2.

Figure 12:
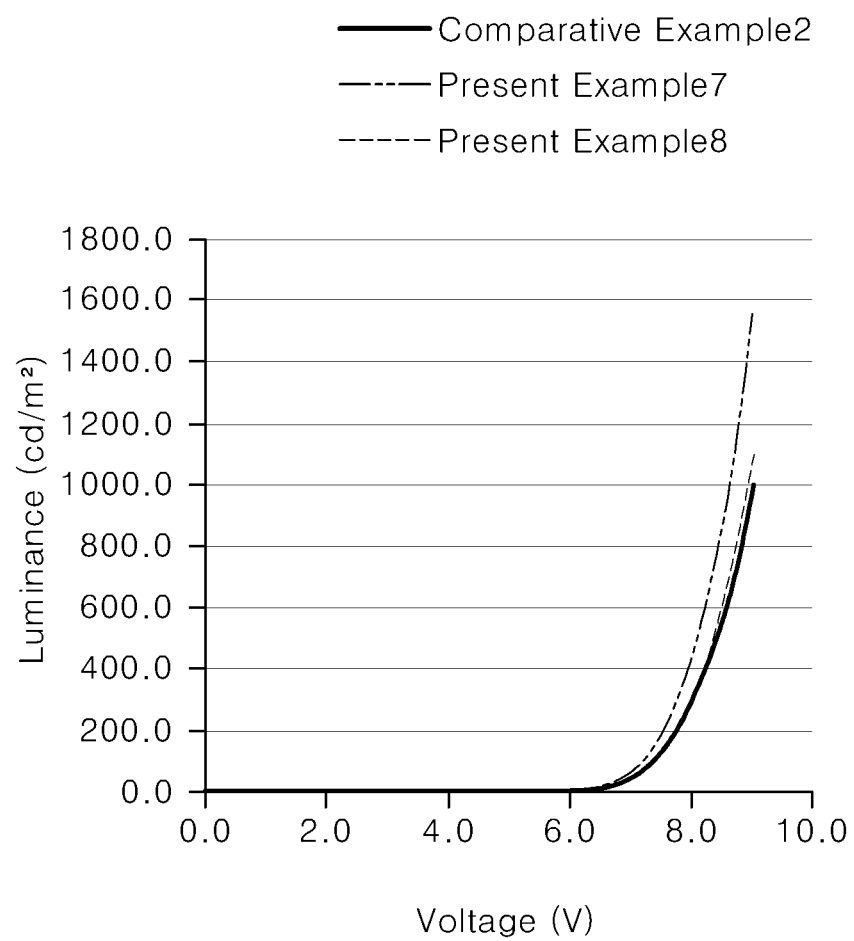
FIG. 12 shows an evaluation result of luminance based on a voltage for each of specimens in accordance with Comparative Example 2, Present Example 7 and Present Example 8.

FIG. 12 shows the evaluation results of luminance based on a voltage for specimens in accordance with Comparative Example 2, Present Example 7 and Present Example 8. Referring to FIG. 12, the organic light-emitting device specimen according to Present Example 7 exhibits relatively higher luminance compared to that of the organic light-emitting device specimen according to Comparative Example 2. It may be seen that the organic light-emitting device specimen according to Present Example 8 exhibits similar level luminance to that of the organic light-emitting device specimen according to Comparative Example 2.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting device comprising:
   an anode;
   an organic light-emissive layer on the anode; and
   a cathode on the organic light-emissive layer, wherein the anode includes:
   a first layer;
   a second layer on the first layer, wherein the second layer includes a metal; and
   a third layer on the second layer, wherein the third layer has a higher work function than a work function of the first layer,
   wherein the third layer includes copper aluminum oxide, wherein the copper aluminum oxide is composed of about 50 to 60% by weight of CuO and about 40 to 50% by weight of Al$_x$Ga$_{2-x}$O$_3$ (0≤x≤2).

2. The organic light-emitting device of claim 1, wherein the first layer includes one or more of indium tin oxide or indium zinc oxide.

3. The organic light-emitting device of claim 1, wherein the metal of the second layer includes at least one of silver or molybdenum.

4. The organic light-emitting device of claim 1, wherein the third layer has a work function of about 5.1 to 5.3 eV.

5. The organic light-emitting device of claim 1, wherein the third layer includes copper aluminum oxide, copper gallium oxide, or copper aluminum gallium oxide.

6. The organic light-emitting device of claim 5, wherein the third layer has a resistivity of about 102 to 105 Ω·cm.

7. The organic light-emitting device of claim 1, wherein the third layer has a thickness of about 50 to 150 Å.

8. An organic electroluminescent display device comprising:
   a first substrate;
   a thin-film transistor on the first substrate;
   an anode on the first substrate having the thin-film transistor, where the anode is electrically coupled to the thin-film transistor;
   an organic light-emissive layer on the anode; and
   a cathode on the organic light-emissive layer,
   wherein the anode includes:
   a first layer;
   a second layer on the first layer, wherein the second layer includes a metal; and
   a third layer on the second layer, wherein the third layer has a higher work function than a work function of the first layer,
   wherein the third layer includes copper aluminum oxide, wherein the copper aluminum oxide is composed of about 50 to 60% by weight of CuO and about 40 to 50% by weight of Al$_x$Ga$_{2-x}$O$_3$ (0≤x≤2).

9. The organic electroluminescent display device of claim 8, wherein the organic electroluminescent display device further comprises a cathode auxiliary electrode substantially coplanar with the anode, and electrically coupled to the cathode.

10. The organic electroluminescent display device of claim 8, wherein the first layer includes either indium tin oxide or indium zinc oxide.

11. The organic electroluminescent display device of claim 8, wherein the metal of the second layer includes at least one of silver or molybdenum.

12. The organic electroluminescent display device of claim 8, wherein the third layer has a work function of about 5.1 to 5.3 eV.

13. The organic electroluminescent display device of claim 8, wherein the third layer includes copper aluminum oxide, copper gallium oxide, or copper aluminum gallium oxide.

14. The organic electroluminescent display device of claim 13, wherein the third layer has a resistivity of about $10^2$ to $10^5$ Ω·cm.

15. The organic electroluminescent display device of claim 8, wherein the third layer has a thickness of about 50 to 150 Å.

\* \* \* \* \*

UNITED STATES PATENT AND TRADEMARK OFFICE
CERTIFICATE OF CORRECTION

| | | |
|---|---|---|
| PATENT NO. | : 11,910,627 B2 | |
| APPLICATION NO. | : 17/466834 | |
| DATED | : February 20, 2024 | |
| INVENTOR(S) | : Changeun Kim et al. | |

It is certified that error appears in the above-identified patent and that said Letters Patent is hereby corrected as shown below:

In the Claims

Column 14, Claim 1, Line 18:
"Al$_x$Ga$_{2-x}$O$_3$ (O≦x≦2)."
Should read:
--Al$_x$Ga$_{2-x}$O$_3$ (0≦x≦2).--

Column 14, Claim 6, Line 31:
"102 to 105 Ω·cm."
Should read:
--$10^2$ to $10^5$ Ω·cm.--

Signed and Sealed this
Fifth Day of November, 2024

Katherine Kelly Vidal
*Director of the United States Patent and Trademark Office*